(12) United States Patent
Nardelli

(10) Patent No.: US 8,238,990 B2
(45) Date of Patent: *Aug. 7, 2012

(54) GRANULAR SUPERCONDUCTING JOINT

(75) Inventor: Davide Nardelli, Genoa (IT)

(73) Assignee: ASG Superconductors, S.p.A., Genova (IT)

( * ) Notice: Subject to any disclaimer, the term of this patent is extended or adjusted under 35 U.S.C. 154(b) by 595 days.

This patent is subject to a terminal disclaimer.

(21) Appl. No.: 12/425,035

(22) Filed: Apr. 16, 2009

(65) Prior Publication Data

US 2009/0264297 A1    Oct. 22, 2009

Related U.S. Application Data

(60) Provisional application No. 61/071,192, filed on Apr. 17, 2008.

(51) Int. Cl.
    *H01B 12/00*      (2006.01)
(52) U.S. Cl. ......... 505/230; 505/220; 505/231; 505/236
(58) Field of Classification Search .................. 505/230, 505/220, 231, 236
See application file for complete search history.

(56) References Cited

U.S. PATENT DOCUMENTS

| | | | |
|---|---|---|---|
| 4,713,878 A | 12/1987 | Kumpitsch et al. | |
| 5,134,040 A | 7/1992 | Benz et al. | |
| 5,255,837 A | 10/1993 | Xu et al. | |
| 5,581,220 A | 12/1996 | Rodenbush et al. | |
| 5,604,473 A | 2/1997 | Rodenbush | |
| 7,226,894 B2 | 6/2007 | Raber et al. | |
| 7,337,527 B2 | 3/2008 | Grasso et al. | |
| 2003/0051901 A1* | 3/2003 | Morita et al. | 174/125.1 |
| 2008/0020137 A1* | 1/2008 | Venkataramani et al. | 427/215 |

FOREIGN PATENT DOCUMENTS

| | | |
|---|---|---|
| DE | 10 2006 020 829 A1 | 11/2007 |
| EP | 1 526 586 A2 | 4/2005 |
| GB | 2 448 051 A | 1/2008 |
| JP | 2003-86265 A | 3/2003 |
| WO | WO-2007/128635 A1 | 4/2007 |

OTHER PUBLICATIONS

International Preliminary Report and Written Opinion for PCT/IB2009/005266 filed Apr. 17, 2009.
International Preliminary Report and Written Opinion for PCT/IB2009/005271 filed Apr. 17, 2009.

* cited by examiner

*Primary Examiner* — Edward Cain
(74) *Attorney, Agent, or Firm* — Venable LLP; Robert S. Babayi; Leigh D. Thelen

(57) ABSTRACT

A superconducting joint that structurally binds a first superconducting segment to a second superconducting segment. The first and second superconducting segment each include corresponding areas containing a granular superconducting substance formed by a first element and a second element. The superconducting joint includes a solid non-superconducting binding formed from a source of the first element and a source of the second element combined to produce the granular superconducting substance around the solid non-superconducting binding to permit for the flow of superconducting current through the first superconducting segment and the second superconducting segment.

19 Claims, 14 Drawing Sheets

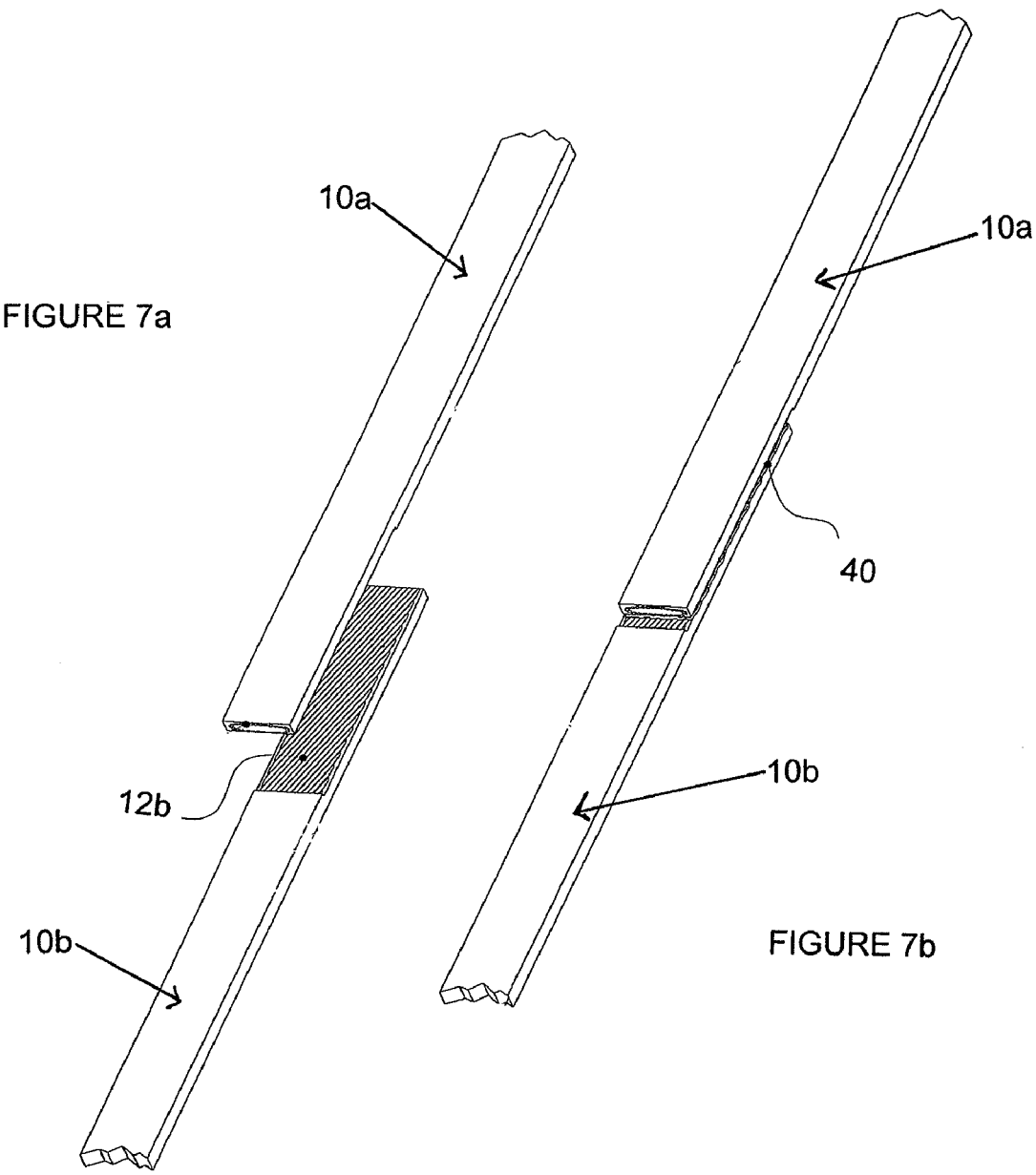

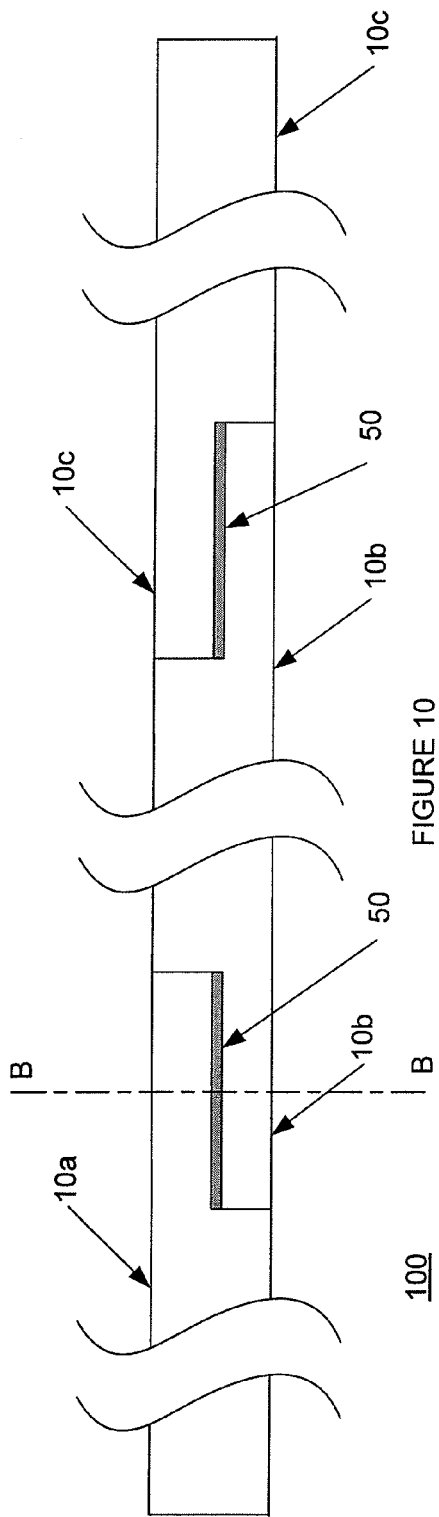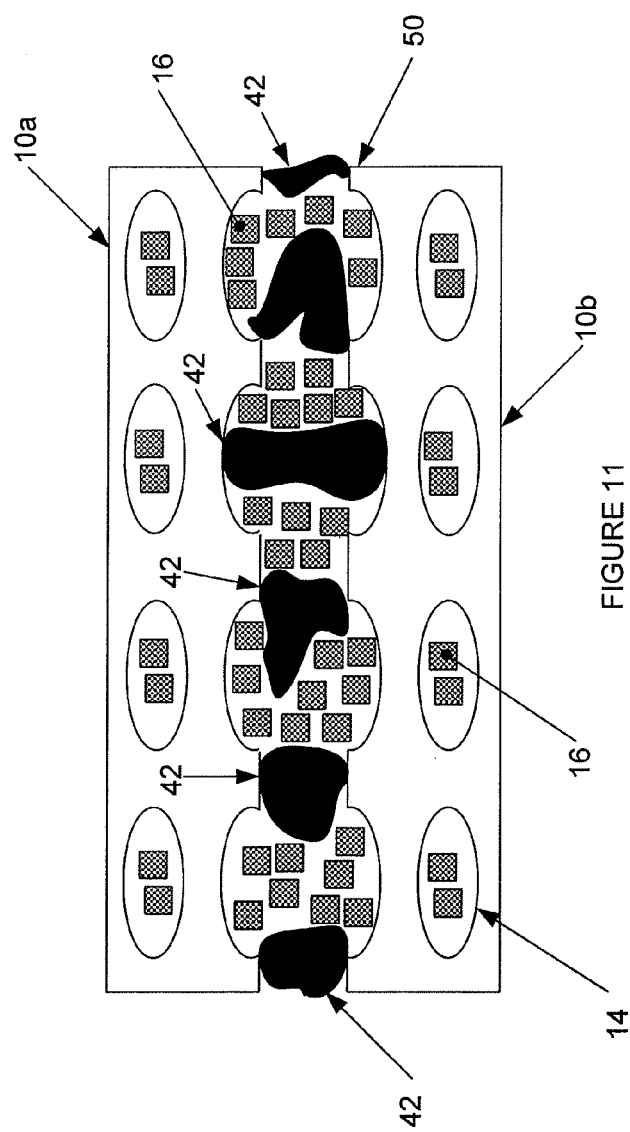

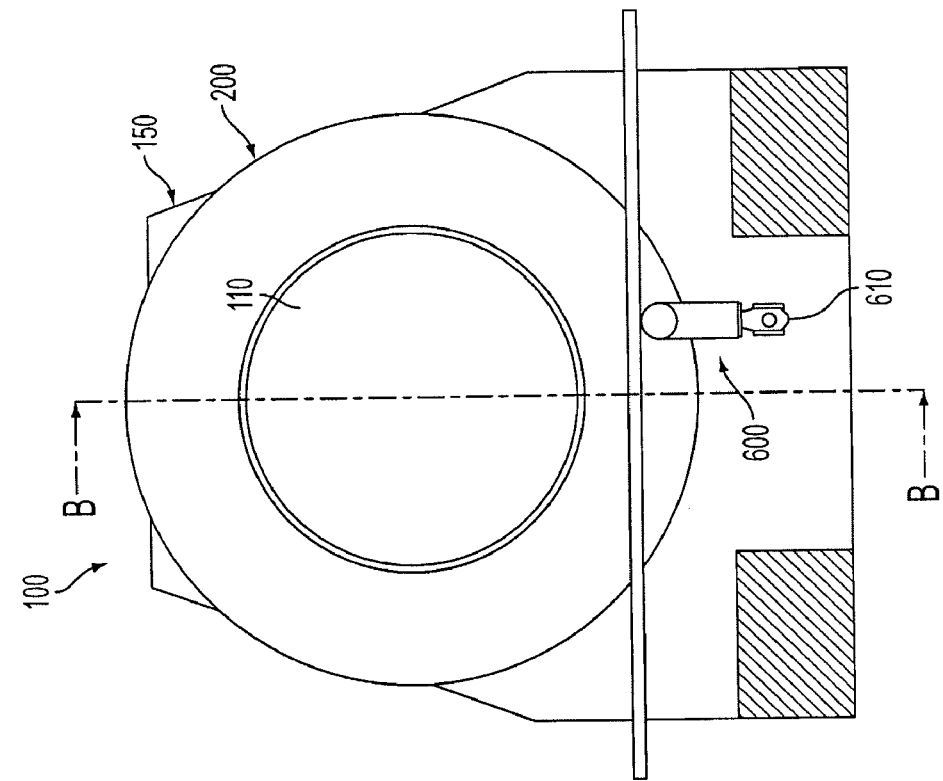
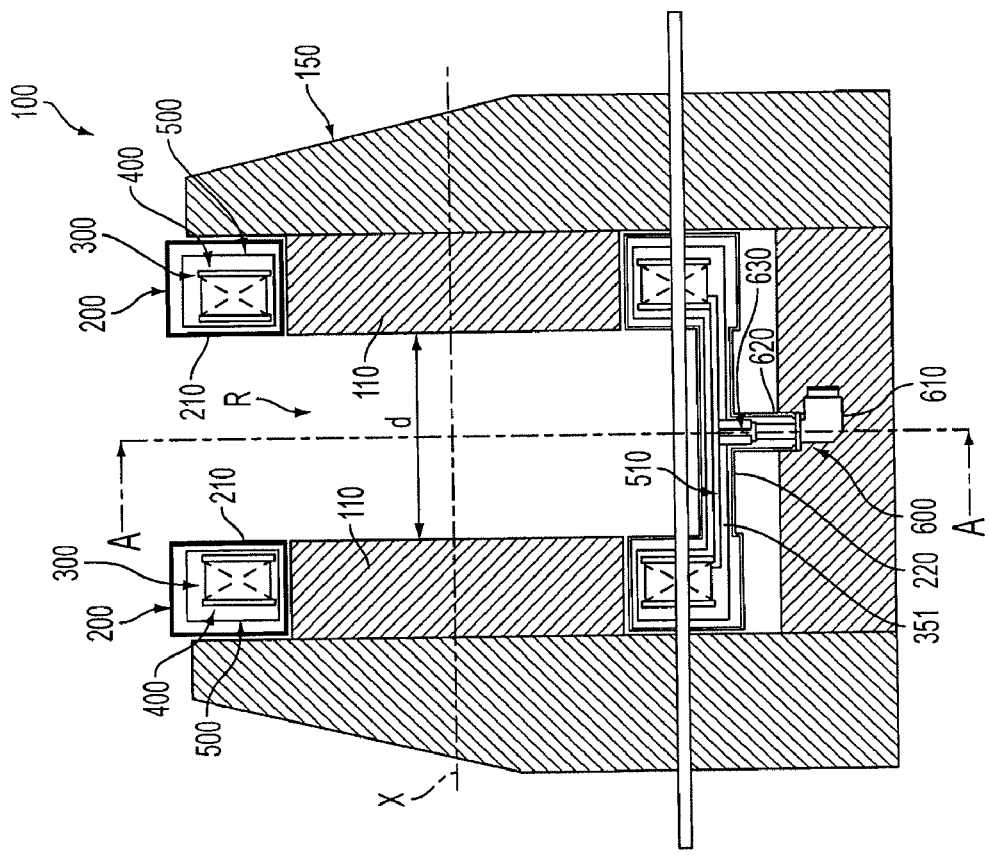
FIG. 16a
FIG. 16b

GRANULAR SUPERCONDUCTING JOINT

CROSS-REFERENCE TO RELATED APPLICATION

This application claims the priority of Provisional Application No. 61/071,192, filed on Apr. 17, 2008. This application is related to an application Ser. No. 12/250,030 entitled "Superconducting Coil having a Granular Superconducting Junction," naming the inventor of the present application, which is hereby incorporated by reference. This application is also related to application Ser. No. 12/342,773, filed on Dec. 23, 2008, which is hereby incorporated by reference.

BACKGROUND OF THE INVENTION

Superconductivity is a phenomenon occurring in certain materials at extremely low temperatures, characterized by exactly zero electrical resistance and the exclusion of the interior magnetic field (known as the Meissner effect). An electric current flowing in a uniformly continuous loop of a superconducting wire, segment or cable can persist indefinitely with no power source. However, uniformity of the electric current is limited by the length of the superconducting wire, segment or cable. In order to increase a length of a superconducting wire, segment or cable, superconducting wire segments are connected to each other through joints.

U.S. Pat. No. 7,226,894 to Raber et al. discloses cleaning two endings of superconducting cables by metallic non-superconducting sheath to expose superconducting surfaces. Subsequently, the superconducting surfaces are pressed against each other to form a bridging connection. Spot welding is also disclosed for forming the connection. The exposed surfaces can also be heated to obtain continuity reaction between them.

World Intellectual Property Organization Document No. WO 2007/128635 A1 discloses arranging superconducting wires in a sleeve or bush, adding magnesium diboride (MgB2) and reducing the sleeve.

U.S. Pat. No. 4,713,878 to Kumpitsch et al. discloses putting superconducting wires in a solidified superconducting mold metal.

U.S. Pat. No. 5,134,040 to Benz et al. discloses connecting wires with metals constituting niobium tin (Nb3Sn) superconductor followed by heating the connected wires in order to obtain reaction between metals and thus creating a superconductor bridging.

U.S. Pat. No. 5,255,837 to Xu et al. discloses a method of forming a low resistance lap joint suitable for joining magnet coils in a superconducting magnet assembly on a magnet drum by forming a flat solder sandwich within a groove on the drum and moving a heat source along the lap joint with controlled temperature, pressure and rotational speed of the drum.

U.S. Pat. No. 5,604,473 to Rodenbush and U.S. Pat. No. 5,581,220 to Rodenbush et al. disclose short bridging segments of superconducting material that are used to electrically connect individual double pancake coils together in a series circuit, where the bridging segments are made of the same material used for winding the coils themselves.

These known methods suffer from a number of drawbacks which makes them unsuitable for creating joints between superconducting segments that achieve superconductivity using a granular superconducting material, such as magnesium diboride (MgB2), which can not be easily pressed or reduced. In one arrangement, U.S. Pat. No. 7,337,527 to Grasso et al., which is hereby incorporated by reference in its entirety, discloses a method of manufacturing superconducting wires having a plurality of filaments comprising a magnesium diboride (MgB2) granular superconducting substance. The application of high pressure to such filaments can cause breakage. On the other hand, the application of lower pressure to such filaments would produce inefficient connections between superconducting filaments for carrying a useful amount of current.

Further, the use of so-called "low temperature superconductors" (for example, niobium tin (Nb3Sn), niobium titanium (NbTi) and niobium aluminide (Nb3Al), etc.) and the related techniques for joining them produce a "low temperature superconducting joint." This low temperature joint structure, however, eliminates the high critical temperature advantage of magnesium diboride (MgB2).

Meanwhile, the use of the so-called "high temperature superconductors" (for example, Bismuth strontium calcium copper oxide (BSCCO), Yttrium barium copper oxide (YBCO), etc.) and related technique for joining them produces a "high temperature superconducting joint." Due to flux pinning instabilities, a typical problem with this type of high-temperature structure is that only a very-low resistance joint is created and it is not possible to obtain a real superconducting joint.

Therefore, a general need exists for efficiently joining superconducting segments that comprise granular superconducting substances.

SUMMARY

Briefly, according to one aspect of the present invention, a superconducting joint structurally binds a first superconducting segment to a second superconducting segment. Each of the first or second superconducting segments comprises corresponding areas containing a granular superconducting substance formed by a first element and a second element. The superconducting joint according to one embodiment of the invention comprises a solid non-superconducting binding formed from a source of the first element and a source of the second element combined to produce the granular superconducting substance around the solid non-superconducting binding to permit for the flow of superconducting current through the first superconducting segment and the second superconducting segment.

According to some of the more detailed features of the invention, the solid non-superconducting binding comprises at least one of a metallic structure or an alloy structure. Further, at least one of the first superconducting segment and the second superconducting segment could be a plurality of longitudinal filaments containing the granular superconducting substance.

According to other more detailed features of the invention, the first element comprises magnesium and the second element comprises boron. The granular superconducting substance comprises magnesium diboride. Alternatively, at least one of the sources of the first or second element comprises a binary source or a ternary source. Examples of sources of the first source or second element may include aluminum, carbon, cobalt, chromium, iron, manganese, molybdenum, niobium, nickel, palladium, ruthenium, scandium, silicon, titanium, vanadium, yttrium, zirconium, cerium, platinum, cadmium, gallium, gadolinium, geranium, hydrogen, lanthanum, lead, tin, strontium, thallium, zinc, iridium or copper.

According to still more detailed features of the invention, each of the first and second superconducting segments comprise a conductive area and the joint further comprises a solid non-superconducting binding structurally coupling the conductive area of the at least one superconducting segment to the conductive area of the at least one superconducting segment. The conductive areas form filaments containing the granular superconducting substance.

According to another aspect of the present invention, a superconducting wire comprises a first superconducting segment and a second superconducting segment. A superconducting joint structurally binds the first superconducting segment to the second superconducting segment. Each of the first and second superconducting segments comprise corresponding areas containing a granular superconducting substance formed by a first element and a second element, the superconducting joint comprising a solid non-superconducting binding formed from a source of the first element and a source of the second element combined to produce the granular superconducting substance around the solid non-superconducting binding to permit for the flow of superconducting current through the first superconducting segment and the second superconducting segment.

According to some of the more detailed features of this aspect of the invention, at least one of the first superconducting segment and the second superconducting segment comprises a plurality of longitudinal filaments containing the granular superconducting substance.

According to still another aspect of the invention, a method for structurally binding a first superconducting segment to a second superconducting segment exposes areas of the first superconducting segment and the second superconducting segment, which contain a granular superconducting substance formed by a first element and a second element. The first superconducting segment is positioned relative to the second superconducting segment and a granular substance is disposed on the exposed areas of the first superconducting segment and the second superconducting segment. A solid non-superconducting binding is formed between the first superconducting segment and the second superconducting segment from a source of the first element and a source of the second element combined to produce the granular superconducting substance around the solid non-superconducting binding to permit for the flow of superconducting current through the first superconducting segment and the second superconducting segment.

According to some of the more detailed features of this aspect of the invention, the solid non-superconducting binding comprises at least one of a metallic structure or an alloy structure. Further, at least one of the first superconducting segment and the second superconducting segment may comprise a plurality of longitudinal filaments containing the granular superconducting substance. Additionally, at least one of the sources of the first or second element comprises at least one of a binary source or a ternary source.

According to other more detailed features of this aspect of the invention, the step of structurally binding comprises heating the source of the first element and the source of the second element at the exposed areas. Further, sufficient pressure may be applied to permit reaction during the heating of the first element and the source of the second element at the exposed areas.

According to still more detailed features of this aspect of the invention, the step of exposing the areas comprises one of mechanical etching, chemical etching, mechanical grinding, metal melting or cutting. Further, the step of positioning may require orienting the exposed areas to lie adjacent to each other or orienting the exposed areas to face each other.

BRIEF DESCRIPTION OF THE DRAWINGS

The present invention will be more readily understood from the following detailed description when read in conjunction with the accompanying drawings, in which:

FIGS. 7a and 7b depict an overlapping superconducting joint according to yet another embodiment of the invention.

FIG. 10 shows the side view of a superconducting wire made up of a number of superconducting segments electrically connected to each other via superconducting joints formed according to any of the embodiments discussed above.

FIG. 11 is a cross-sectional view of the superconducting wire of FIG. 10 along the B-B axis.

FIGS. 14a-14e are perspective views of different embodiments of superconducting coils coupled to each other via overlapping junctions shown in FIG. 13a.

FIGS. 15-16 show by way of example, a magnet of an open magnetic resonance imaging apparatus.

DETAILED DESCRIPTION

Figure 1:
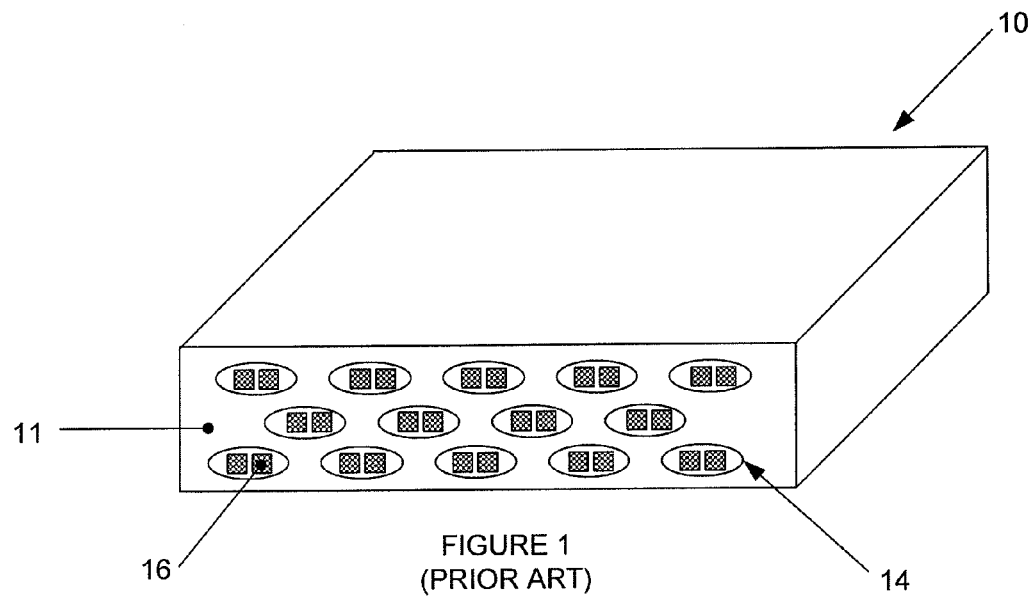
FIG. 1 is a cross-sectional view of a conventional superconducting segment.

FIG. 1 is a cross-sectional view of a conventional superconducting segment (10). The superconducting segment 10 can be used as a part of a wire or a coil according to various aspects of the present invention. The superconducting segment 10 is a non-superconducting metallic sheath 11 surrounding a plurality of inner filaments 14 that contain a granular superconducting substance 16. This embodiment is further described in U.S. Pat. No. 7,337,527 to Grasso et al. which is incorporated herein by reference. The superconducting segment 10 may also be used in superconducting single pancake, double pancake and solenoid coils, as well as in wires or cables. In one embodiment, the granular superconducting substance 16 is made from at least a first element and a second element. An example of such a superconducting substance includes magnesium diboride. The filament 14 may contain any other suitable granular superconducting substance. The granularity of the superconducting substance 16 contained in the filaments 14 may be in any form of a powder or grain-like material.

Figure 2:
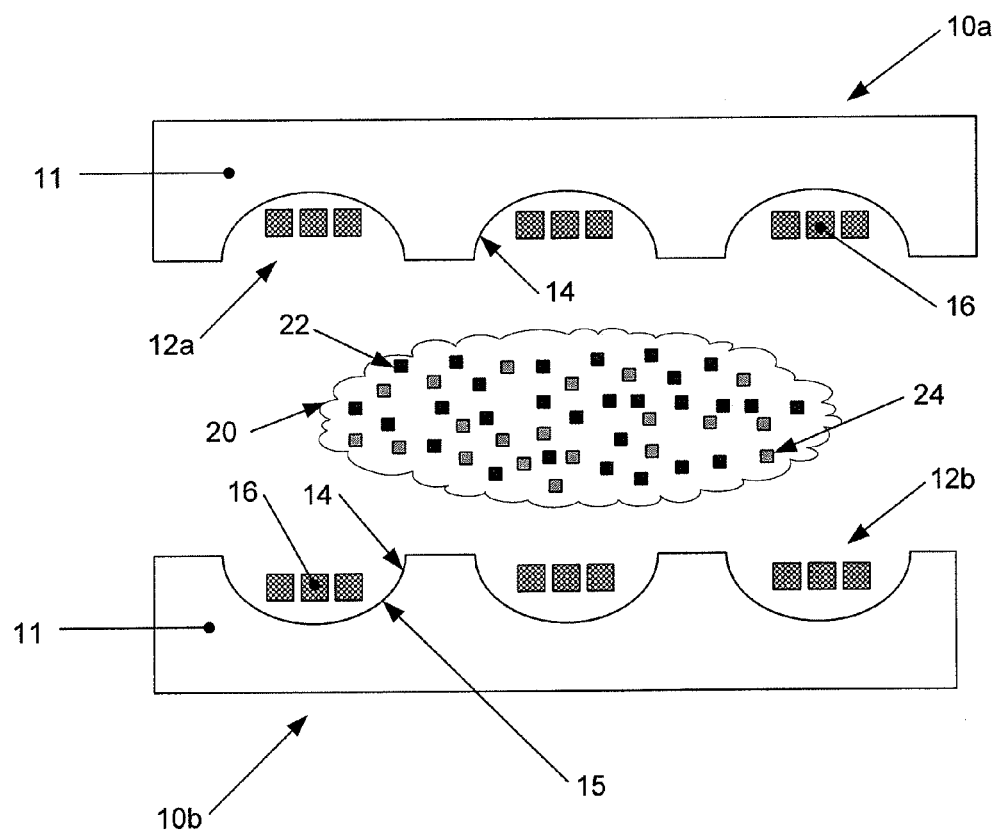
FIG. 2 is an exploded cross-sectional view depicting two superconducting segments and a granular precursor substance, wherein the segments are reacted to form a joint according to the present invention.

FIG. 2 is an exploded cross-sectional view depicting two superconducting segments and a granular precursor substance 20 which segments are reacted to form a joint according to the present invention. The superconducting joint is formed by first exposing corresponding areas of a first superconducting segment 10a and a second superconducting segment 10b. The two exposed areas 12a, 12b contain a granular superconducting substance, that in the example of FIG. 1 comprises magnesium diboride (MgB2). The step of exposing the filament 14, for example, removes a portion of the non-superconducting metallic sheath 11 by chemical etching, mechanical etching, mechanical grinding, metal melting or metal cutting, or otherwise exposing the filaments 14 without breaking them. The exposure of the filaments 14 exposes the granular superconducting substance 16 contained within a recessed area 15 of the filament 14.

Next, a granular precursor substance 20 is disposed between at least the exposed areas 12a, 12b. Preferably, the precursor granular substance 20 is made of a material that can be reacted with the granular superconducting substance 16 contained within the filaments 14 to produce one or more solid non-superconducting bindings that allow for a flow of electrons between the superconducting segments 10a and 10b. In one embodiment, the granular superconducting substance 16 comprises a first element and a second element, each comprising a chemical that when reacted together form a superconducting material. The granular precursor substance 20 comprises a source of the first element 22 and a source of the second element 24.

Figure 3:
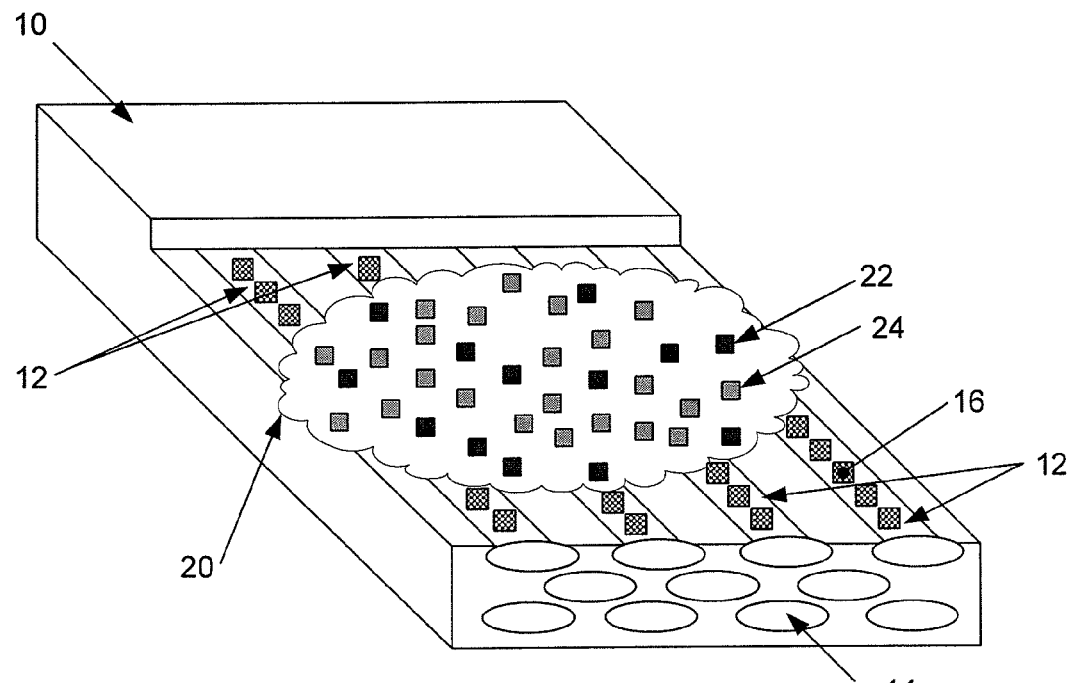
FIG. 3 is an isometric view of FIG. 1 depicting a deposit of the granular precursor substance being applied to the exposed areas of the superconducting segment.

FIG. 3 is an isometric view of FIG. 1 depicting a deposit of the granular precursor substance 20 being applied to the exposed areas 12 of the superconducting segment 10. FIG. 3 also depicts the exposed areas 12 formed on the filaments 14 that contain the granular superconducting substance 16, which can react with the first element source 22 and the second element source 24 contained in the granular precursor substance 20.

In one embodiment, the granular superconducting substance 16 comprises magnesium diboride (MgB2) having magnesium as its first element and boron as its second element. An example of the first element source 22 of magnesium could be aluminum magnesium (Al2Mg2), and an example of the second element source 24 of boron could be aluminum diboride (AlB2). The two sources 22, 24 may be combined to form the granular precursor substance 20, which when reacted with the exposed granular superconducting substance 16, magnesium diboride (MgB2), forms one or more non-superconducting material, aluminum, which creates a solid structure that allows non-superconducting current flow. The granular superconducting substance 16, magnesium diboride, created around the solid structure as a result of the reaction coupled with the same material within the exposed areas 12a and 12b allows for current flow while the non-superconducting binding, aluminum, would structurally bind the first and second superconducting segments 10a, 10b to create a superconducting joint.

In an embodiment, the sources 22, 24 are binary compounds. For magnesium diboride, examples of boron-containing binary compounds include: AlB2, B2C, CoB, CrB2, FeB, Fe2B, MnB4, MnB, Mn2B, MoB4, BNb, Ni4B3, Pd5B2, RuB, ScB2, ScB13, SiB6, SiB3, TiB2, Ti3B4, VB3, YB2 and B2Zr. Examples of magnesium-containing binary compounds include: Al2Mg2, Al12Mg17, Mg2Ca, Mg3Bi2, CdMg3, Cd3Mg, CdMg, Cu2Mg, CuMg2, Mg5Ga2, Mg6Gd, Mg2Ge, MgH2, Mg17La2, Mg2Ni, MgNi2, MgPb, Mg2Si, Mg2Sn, Mg17Sr2, Mg5Tl, Mg2Y and MgZn.

In another embodiment, the sources 22, 24 are ternary compounds. For magnesium diboride, examples of boron-containing ternary compounds include: CePt2B, CePt2In2, MgB12Si2, MgB2Ni2.5, Sc3B0.75C3 and Sc2B1.1C3.2. Examples of magnesium-containing ternary compounds include: Mg3Cr2Al18, Mg3Co2Ga7, Mg15Ir5Si2, Ca4Al3Mg and Mg6Si7Cu16.

Any other type of suitable compound for known first chemical elements that form a superconducting substance with second chemical elements may be used. Indeed, the first and second sources may be a pure source of the first and second element rather than a compound.

Additionally, according to another embodiment, pure sources, binary compounds and ternary compounds may be used for the sources 22, 24 in combination. For example, the first source may be a binary compound and the second source may be a ternary compound, or vice versa. Moreover, the source 22, 24 could itself be a combination of two of a pure source, a binary compound and a ternary compound.

In still another embodiment, other non-superconducting elements or compounds that are useful for modifying the reaction properties of the granular precursor substance 20 (for example, enhance or slow down the kinetic reaction) may be added to the substance 20.

Figure 4:
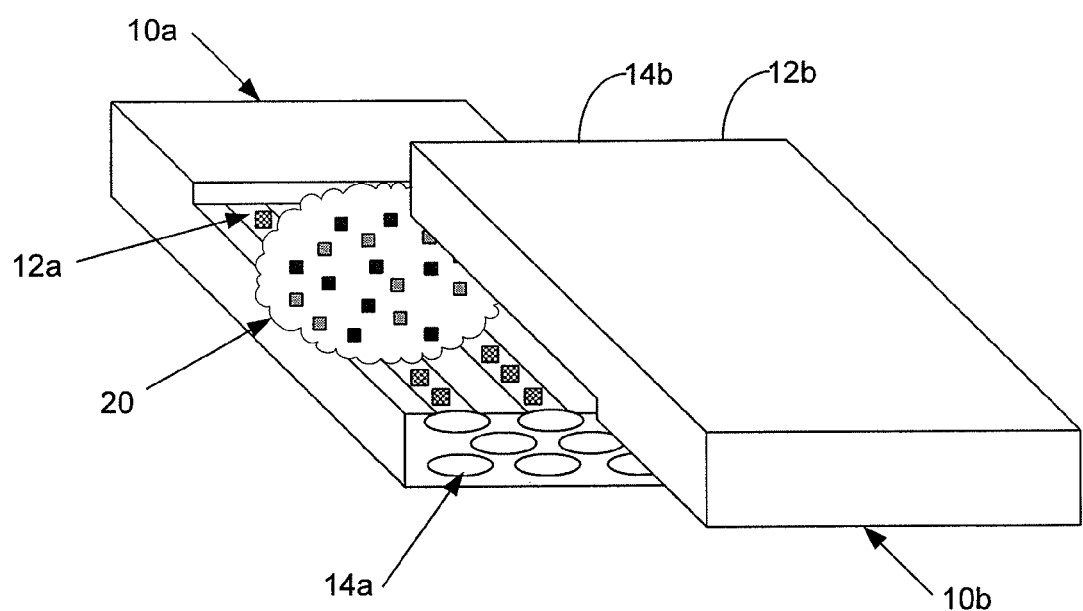
FIG. 4 is an exploded isometric view depicting a deposit of the granular precursor substance being disposed between opposing exposed areas of the first and second superconducting segments.

FIG. 4 is an exploded isometric view depicting a deposit of the granular precursor substance 20 being disposed between opposing exposed areas 12a and 12b of the first and second superconducting segments 10a and 10b. In FIG. 4, the exposed area 12b, positioned at a bottom end of the second superconducting segment 10b, is placed facing the exposed area 12a, positioned at an opposite top end of the first superconducting segment 10a, in an overlapping-configuration. In this way the granular precursor substance 20 can be applied to at least one of the exposed areas 12a or 12b and couple to the corresponding granular superconducting substance 16 within filaments 14a and 14b (hidden) of the superconducting segments 10a and 10b.

The positioning of the superconducting segments relative to each other for joining them according to the present invention may be in any suitable orientation, including along a vertical, horizontal or circular axis. For example, the exposed areas of the superconducting segments 10a and 10b can lie adjacent to one another, as shown in FIGS. 5a, 5b, 6a and 6b. In a further embodiment, the exposed areas of the superconducting segments lie facing one another as depicted in FIGS. 7a and 7b.

Figure 5A:
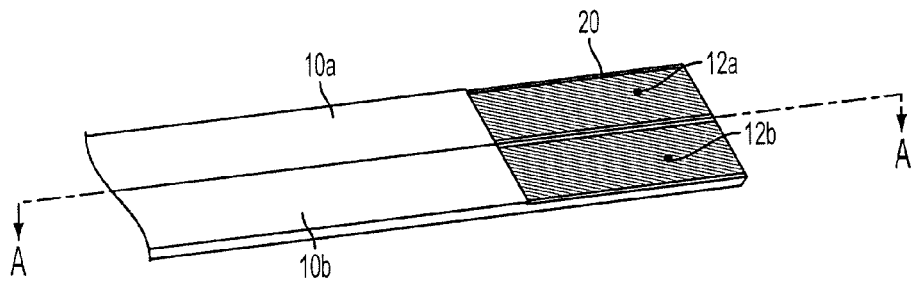
FIGS. 5a and 5b depict a side-by-side superconducting joint.
Figure 5B:
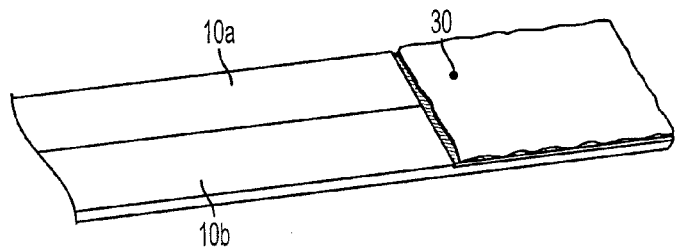

FIGS. 5a and 5b depict a side-by-side superconducting joint 30. FIG. 5a shows two superconducting segments 10a, 10b, each with an exposed area 12a, 12b located at the same top-end surface of the superconducting segment. Also shown is the granular precursor substance 20 applied to the exposed areas 12a and 12b. According to this arrangement, a side of the first superconducting segment 10a is positioned next to an opposing side of the second superconducting segment 10b to position the exposed areas 12a and 12b adjacent to each other along a longitudinal axis A-A. FIG. 5b depicts a side-by-side superconducting joint 30 having been created by reacting the granular precursor substance 20 with the granular superconducting substance 16. The superconducting joint 30 comprises the granular superconducting substance 16 dispersed about a solid non-superconducting binding, as further described below. The side-by-side superconducting joint 30 is particularly beneficial for the coupling of brittle magnesium diboride (MgB2) segments or tapes to avoid the disruption of superconducting continuity through bending.

Figures 6A, 6B:
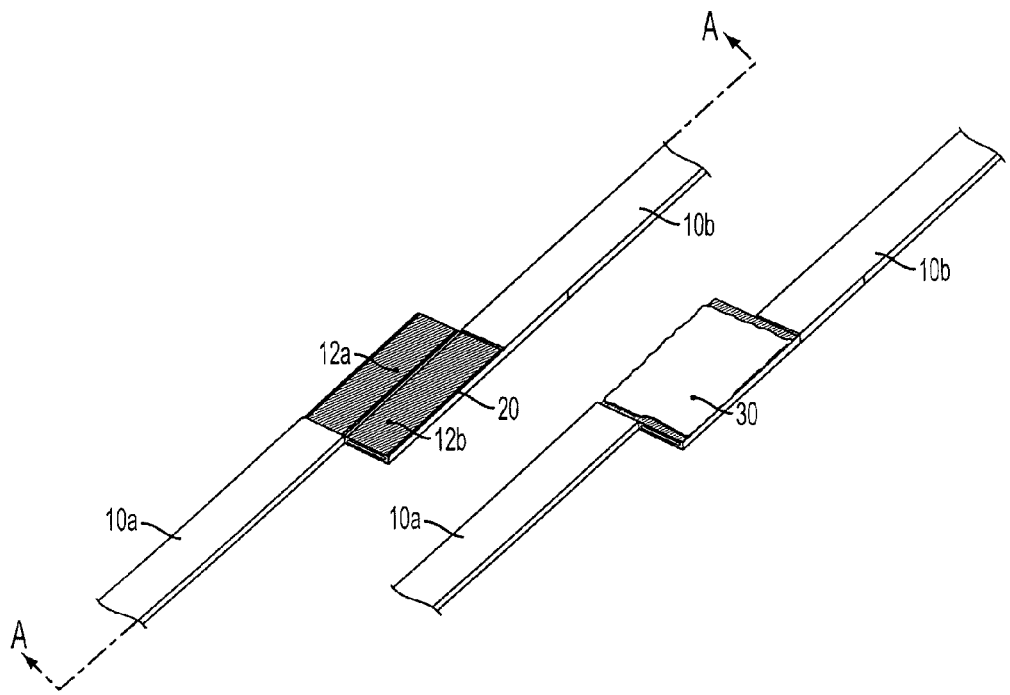
FIGS. 6a and 6b depict a side-by-side superconducting joint according to another embodiment of the invention.

FIGS. 6a and 6b depict a side-by-side superconducting joint 30 according to another embodiment of the invention. FIG. 6a shows a first superconducting segment 10a with an exposed area 12a located at a top-end surface of the first superconducting segment and a second superconducting segment 10b with an exposed area 12b located at an opposite top-end surface of the second superconducting segment. A side along the exposed area 12a of the first superconducting segment 10a is positioned next to an opposing side along the exposed area 12b of the second superconducting segment 10b. Similar to the arrangement of FIGS. 5a and 5b, the exposed areas 12a and 12b lie adjacent to one another along the longitudinal axis A-A with the only differences being the extension arrangement of the first and second superconducting segments 10a and 10b. In FIGS. 5(a) and 5(b) the first and second superconducting segments 10a and 10b run adjacent to one another. In FIGS. 6a and 6b, these first and second superconducting segments 10a and 10b extend in opposite directions of one another.

FIGS. 7a and 7b depict an overlapping superconducting joint 40 according to yet another embodiment of the invention. FIG. 7a shows the first and second superconducting segments 10a and 10b with exposed areas 12a (not shown) and 12b located at a top-end surface of the first superconducting segment 10a and an opposite bottom-end surface of the second superconducting segments 10b, respectively. The bottom-end exposed area 12b of the second superconducting segment 10b is positioned to face the top exposed area 12a (not shown) of the first superconducting segment 10a to overlap the first and second superconducting segments in a vertical direction. In FIG. 7b, the exposed areas 12a, 12b are joined by joint 40.

As described above, creating a superconducting joint, according to the present invention, involves coupling exposed superconductive areas of the first superconducting segment 10a to the second superconducting segment 10b via the granular superconducting substance 16, as well as a non-superconducting material which is solid and allows for flow of electrical current. Such coupling requires a reaction between the granular superconducting substance 16 and the granular precursor substance 20. In one embodiment, the reaction solidifies elements of the first and second source 22, 24 of the granular precursor substance 20 to structurally bridge the gap between the first and second superconducting segments 10a and 10b such that the granular superconducting substance 16 is dispersed around the solid non-superconducting bindings creating a hybrid electrical connection between the first and second superconducting segments 10a and 10b via the superconducting and non-superconducting material. In one embodiment, the reaction solidifies the metallic elements of the granular precursor substance 20 depending on such elements. The joint can be metallic or alloy.

In an embodiment, a thermal treatment is applied to the exposed areas of the first and second superconducting segments with temperatures ranging from 650K to 1250K for a time period that ranges from tens of seconds to several hours. The thermal treatment produces a solid or bulk mass that has a self-standing mechanical integrity that strengthens a brittle superconductor wire, for example a magnesium diboride wire. Known industrial equipment (e.g. oven) may be used for heating purposes with suitable modifications to achieve a desired superconductive binding. According to the embodiment, depending on the application, a suitable amount of pressure may be applied during the thermal treatment to aid in producing the solid or bulk mass.

Figure 8:
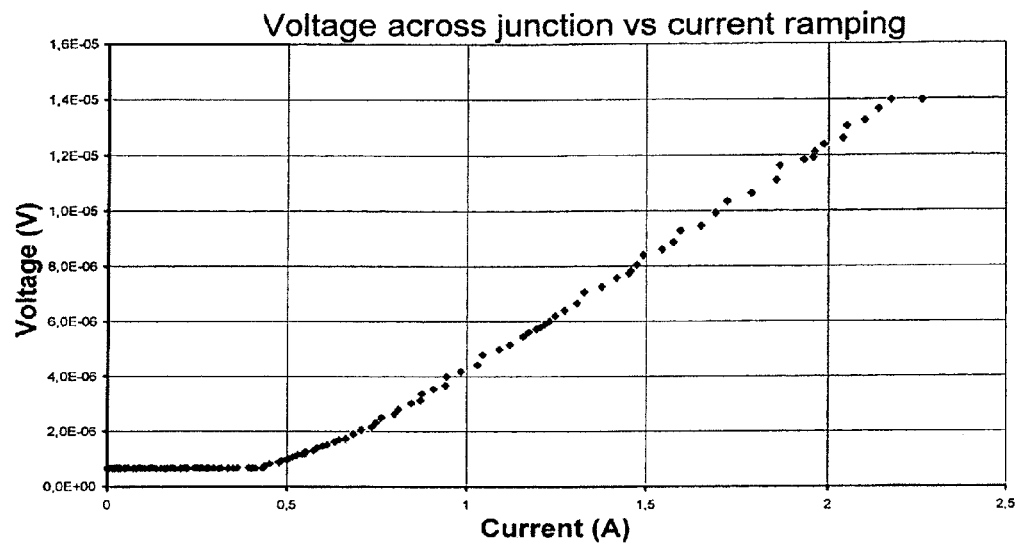
FIG. 8 is a graph showing test results of voltage across a joint for the invention versus current.

Experimental tests illustrate that the superconducting joint of the present invention has the ability to conduct high amounts of current, for example, a large fraction (approximately two-thirds or more) of the critical current of a superconducting segment itself. The inventors of the instant patent application have performed a current persistence test on a small length winding of approximately 1/10 to 2/10 centimeter containing magnesium diboride (MgB2) taped around a cylindrical object to create a single uniformly bent loop. The endings of the loop were structurally and electrically connected via a superconducting joint created according to the present invention. The presence of a real superconducting continuity was verified by directing electrical current to the superconducting loop and observing the current circulating within the loop substantially indefinitely. FIG. 8 is a graph showing the voltage across a junction versus current ramping according to the current persistence test.

Figure 9:
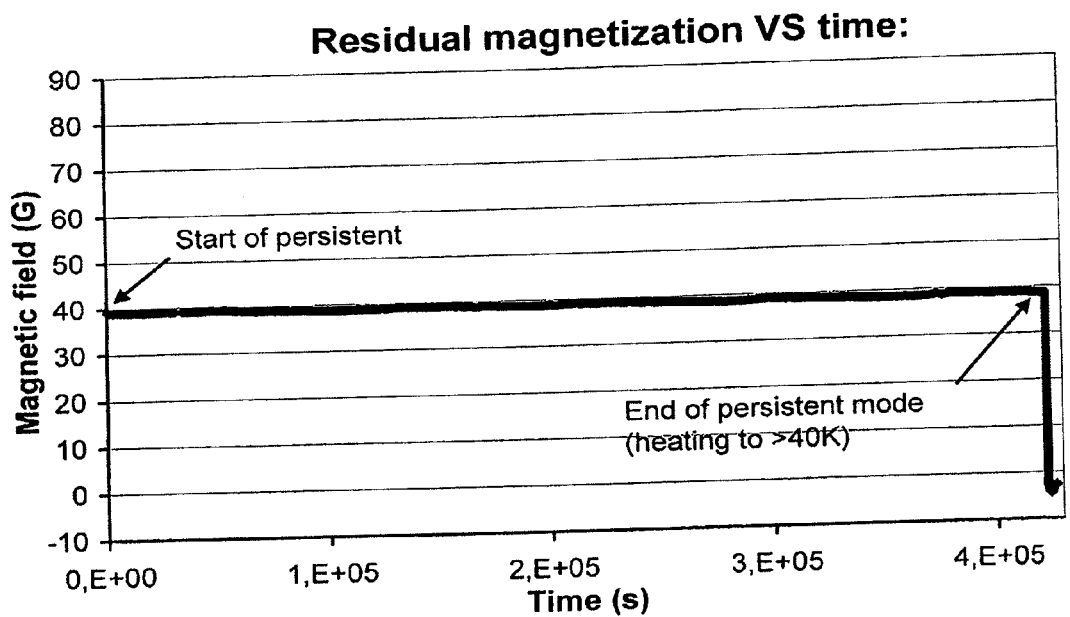
FIG. 9 shows a graph of test results of residual magnetization versus time.

It is further possible to insert a magnetic field sensor inside the loop, thus measuring the magnetic field decayment. If the current does not decay, neither will the magnetic field. By measuring the decaying time, it is possible to measure the resistance of the whole circuit and thus the resistance of the superconducting joint. FIG. 9 shows a graph of residual magnetization versus time depicting that after approximately five days of acquisition, the magnetic field was substantially constant and did not decay within the measurements error/noise limits. The parameters of the graph used the 1) upper limit to the resistance value (R) of a typical first order circuit (i.e. a typical LR circuit), 2) the error/noise spread of 0.5 Grauss and the time of 5 days (or approximately 420,000 seconds), and 3) the inductance of $2 \times 10^{-7}$ Henry. Based on these parameters, an R value of less than $10^{-14}$ Ohm confirms that the joint of the present invention is superconducting.

The superconducting joint of the present invention may be created, implemented or employed in any type of superconducting cable, connections, extensions or devices, for example magnets, MRIs, transformers, power storage devices, electric power transmission, electric motors, or magnetic levitation devices. An advantage of using superconducting joints to build several parts of a modular system (for example, a coil for an MRI magnet) is that the superconducting joints allow the testing of separate parts of the system for defectiveness prior to assembling the entire system.

FIG. 10 shows the side view of a superconducting wire 100 made up of a number of superconducting segments 10a, 10b and 10c electrically connected to each other via superconducting joints 50 formed according to any of the embodiments discussed above.

FIG. 11 is a cross-sectional view of the superconducting wire of FIG. 10 along the B-B axis of FIG. 10. As shown, the superconducting segments 10a and 10b are attached to each other via the granular superconducting substance 16 dispersed around the non-superconducting solid bindings 42. In the shown arrangement, magnesium diboride (MgB2) granular superconducting substance 16 is dispersed around non-superconducting solid binding 42. However, the granular superconducting substance that couples the exposed superconducting areas of the superconducting segments 10a and 10b may be different from the superconducting substance 16 that is within the filaments 14. Any suitable reaction between the first element source 22 and the second element source 24 of a second element can solidify one or more non-superconducting bindings 42 and create granular superconducting substances 16 in the joint 50 between the superconducting segments 10a and 10b, which may contain any type of granular superconducting substance.

In one embodiment, the granular superconducting substance 16 that couples the exposed superconducting areas of the superconducting segments 10a and 10b connects the granular superconducting substance 16 in adjacent filaments 14 to create a superconducting coil in persistent mode. Persistent mode occurs when the winding is short circuited to itself so that there are no connections to an external power supply. Thus, a current flows through the windings without resistance.

Figure 12A:
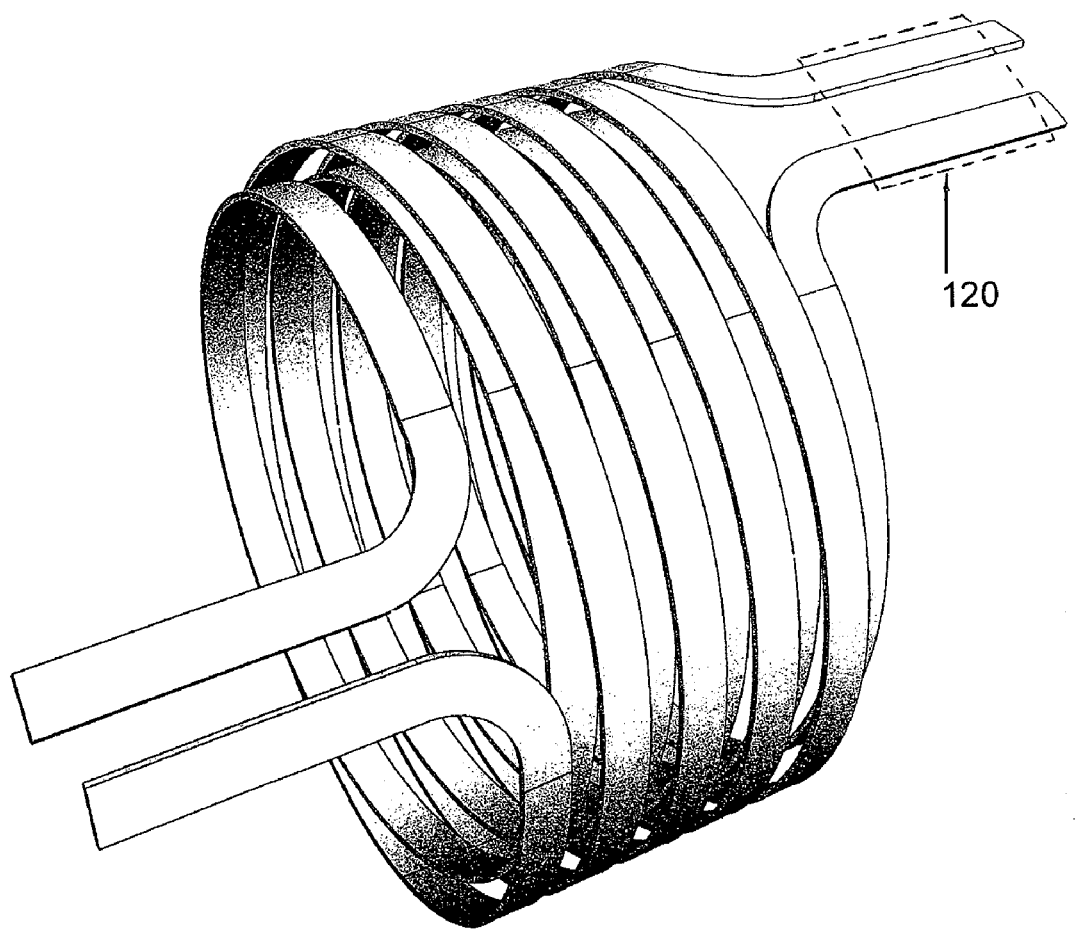
FIGS. 12a-12d show different embodiments of superconducting coils having windings that are coupled to each other via one or more side-by-side junctions.
Figure 12B:
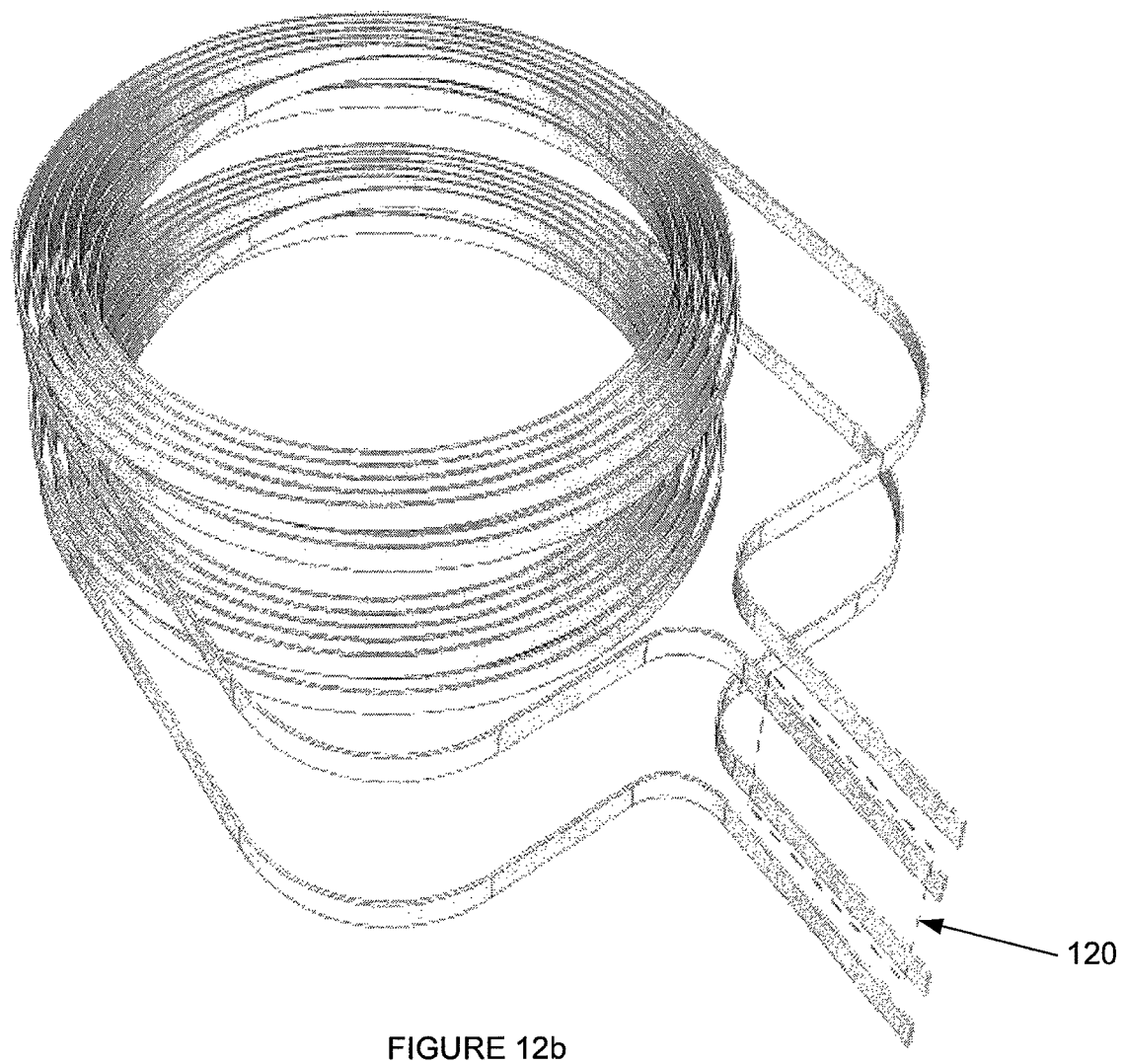
Figure 12C:
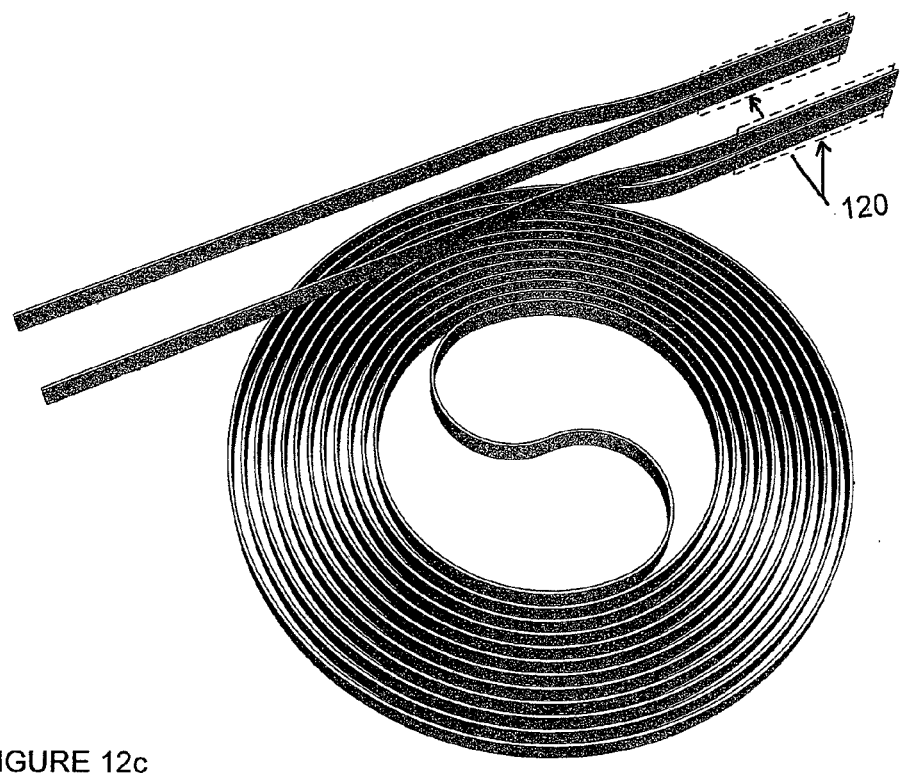
Figure 12D:
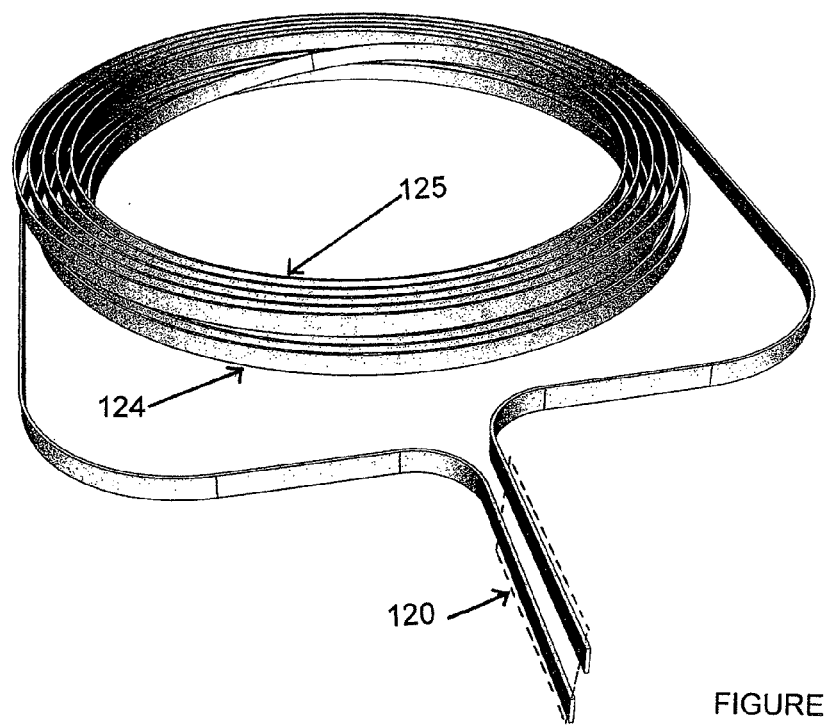

FIGS. 12a-12d show different embodiments of superconducting coils having windings that are coupled to each other via one or more side-by-side junctions 120, as depicted in FIGS. 5a, 5b, 6a and 6b. FIG. 12a is a solenoid coil manufactured by several layers of superconductors. In an embodiment, a superconductor winding or length is completely wound around a previous winding or length and connected through use of a superconductive junction 120. FIG. 12b depicts two double pancake coils with a superconducting junction 120 to connect the two coils. The two electrical ends are short-circuited by a superconducting switch. FIG. 12c depicts a superconducting switch including superconducting junctions 120 from double pancake, single pancake or solenoid coils. FIG. 12d shows two windings 124 and 125 coupled to each other via the side-by-side junction 120.

Figure 13A:
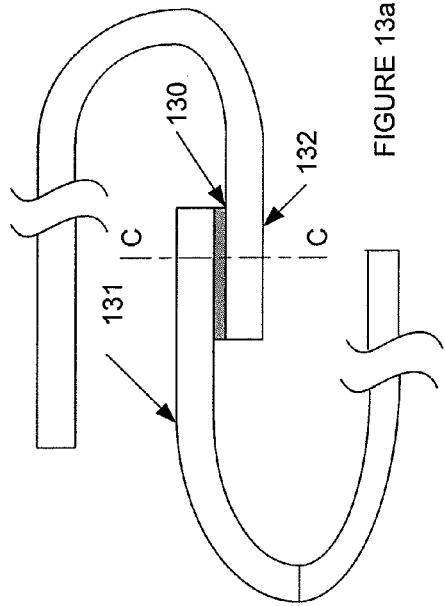
FIG. 13a shows two windings connected to each other by corresponding overlapping junctions.
Figure 13B:
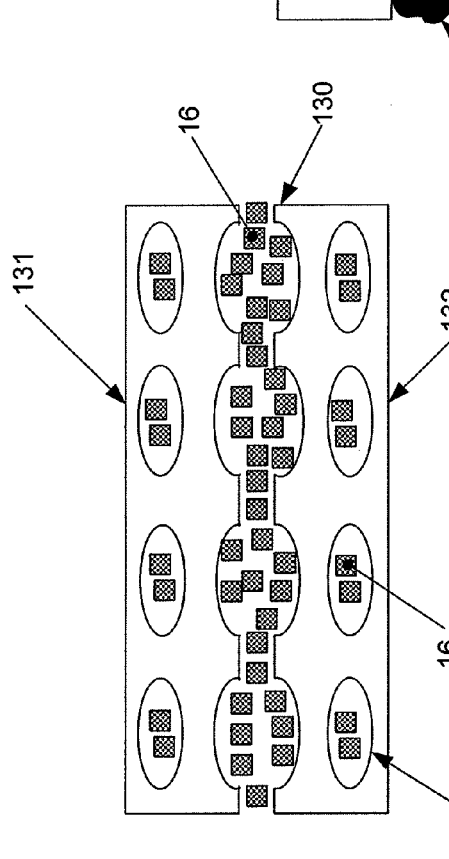
FIG. 13b shows the overlapping junction comprising face-to-face coupling of opposing exposed areas that contain the granular superconducting substance without any solid and bulk non-superconducting structures.

FIG. 13a shows two windings 131 and 132 connected to each other by corresponding overlapping junctions 130. FIGS. 13a and 13b show cross-sectional views of two embodiments of the overlapping junction 130 at axis C-C of FIG. 13. FIG. 13(b) shows the overlapping junction comprising face-to-face coupling of opposing exposed areas that contain the granular superconducting substance 16 without any solid and bulk non-superconducting structures.

Figure 13C:
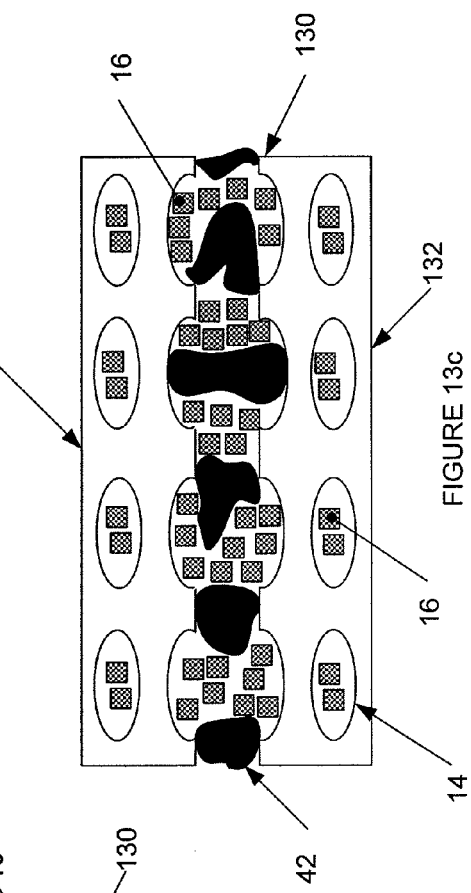
FIG. 13c shows the overlapping junction that also includes the granular superconducting substance being dispersed around the solid non-superconducting structure.

FIG. 13c shows the overlapping junction 130 that also includes the granular superconducting substance 16 being dispersed around the solid non-superconducting structure 42.

FIGS. 14a-14e are perspective views of different embodiments of superconducting coils coupled to each other via overlapping junctions 130 shown in FIG. 13a. Each coil 300 is formed by a plurality of series-connected superconductor windings 301, which are arranged next to each other in stratified form. FIGS. 13a and 13b show a single partial superconducting winding 301, while FIGS. 14b-14e show the set of coils 30 formed by a plurality of partial superconducting windings 301.

Figure 14A:
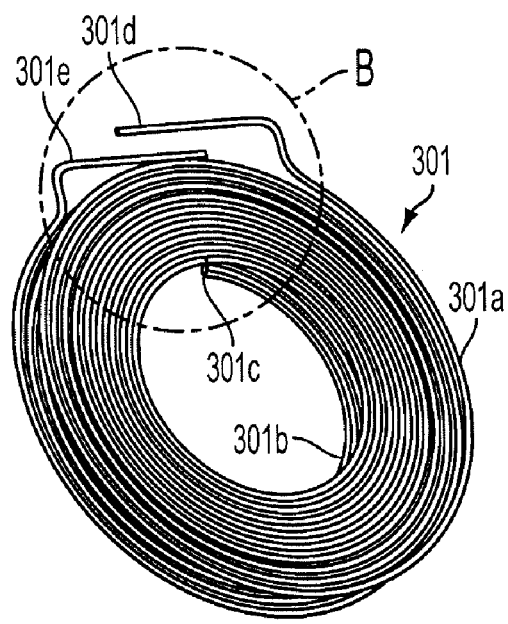
Figure 14B:
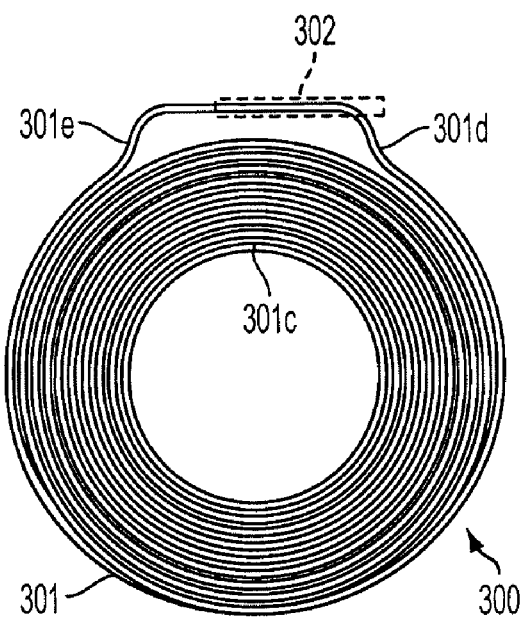
Figure 14C:
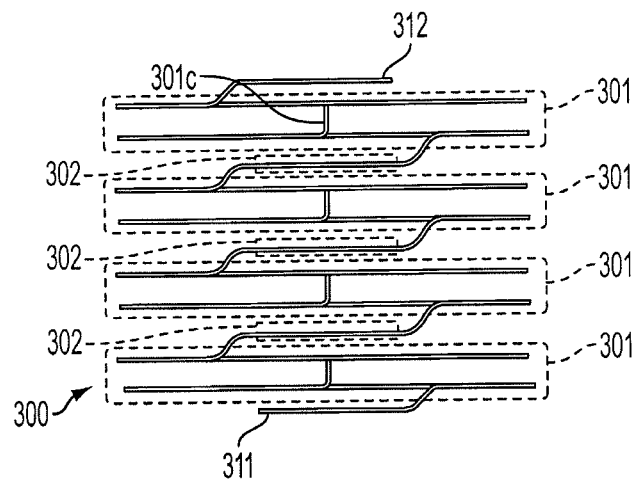
Figure 14D:
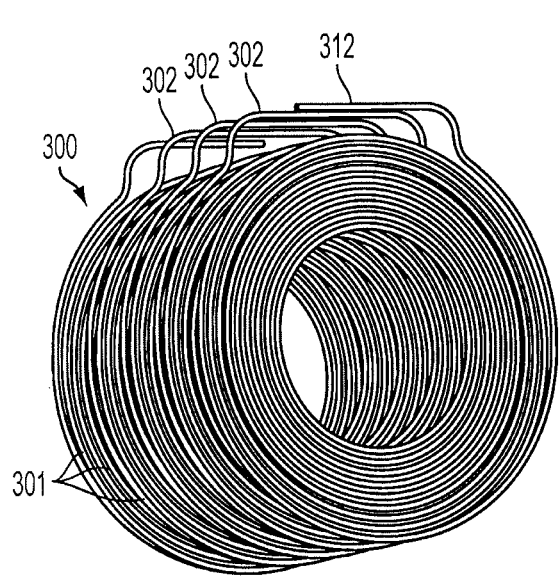
Figure 14E:
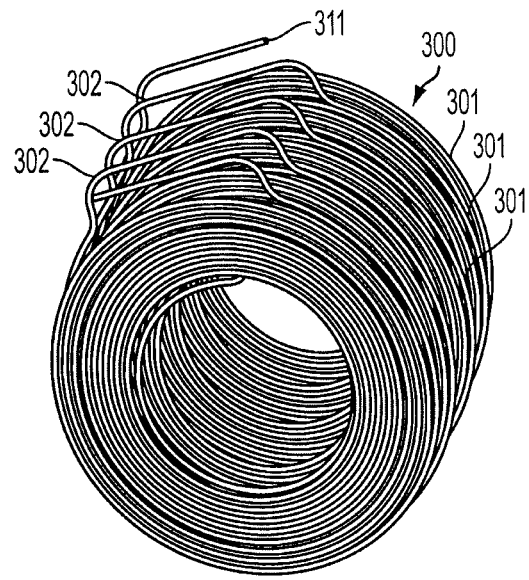
Figure 15:
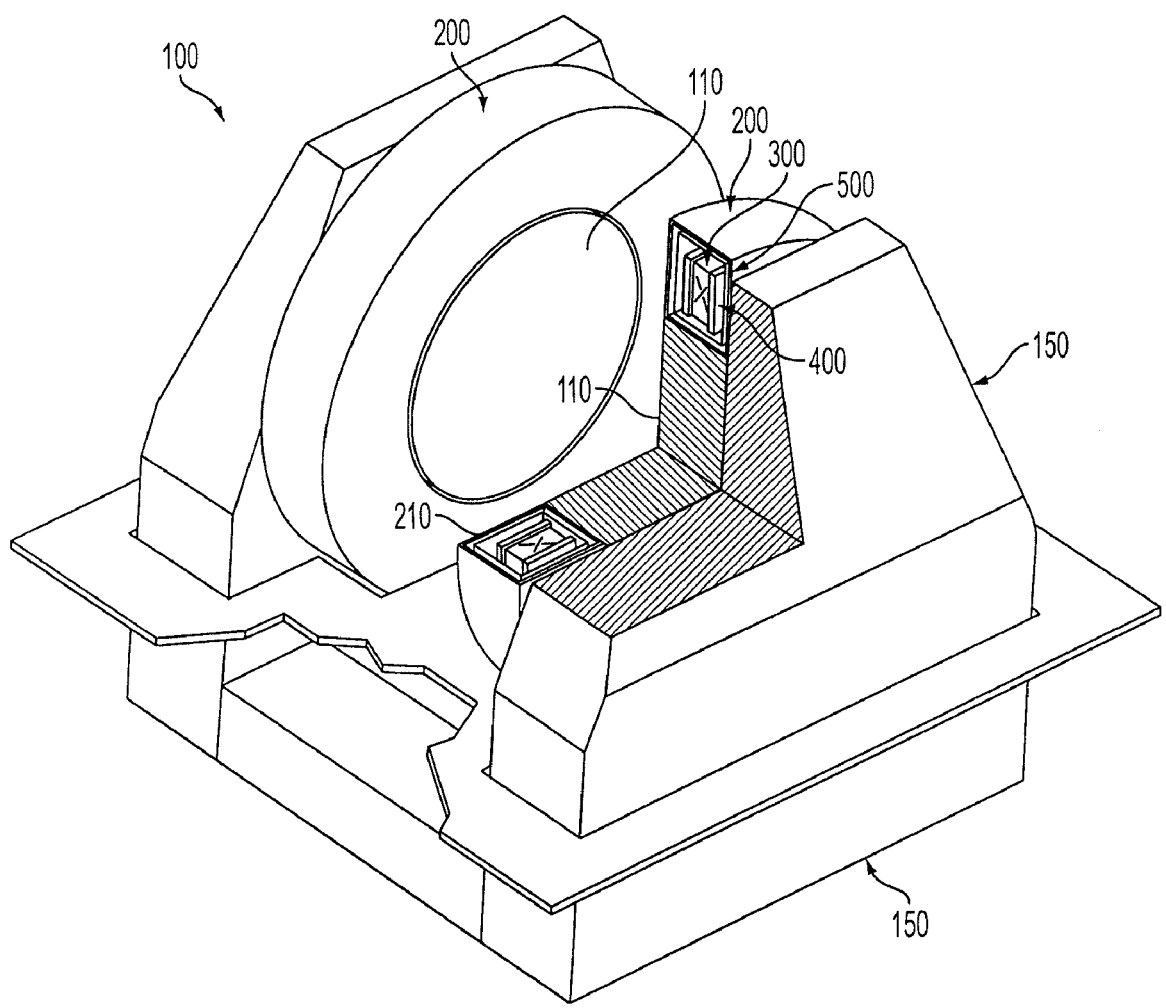

FIGS. 14a-14c show coils of the type known as double-pancake coils 300. As can be seen in FIGS. 13a and 13b, in each partial double-pancake winding 301 the turns are arranged so as to form substantially two layers 301a and 301b which are connected together by means of an overlapping junction 301(c). The overlapping junction 301c comprises a superconducting joint, such as those shown in FIG. 13a or 13b. For the sake of clarity of illustration, these layers are shown separate in the figures; in reality, they lie in contact with each other.

In one embodiment, each winding 301 is monolithic, namely it does not have any joints, and has two opposite outer connecting ends 301d and 301e respectively associated with the layers 301a and 301b so as to allow connection to other windings 301, as illustrated in FIGS. 14b-14e.

In each winding 301, the superconductor has two opposite outer connecting ends 301d and 301e respectively associated with the layers 301a and 301b so as to allow connection via a superconducting joint B to other windings 301, as illustrated in FIGS. 14b-14e. The superconducting joint B can be formed according to any of the embodiments shown in FIGS. 13a and 13b.

According to an embodiment, the superconducting joint, wire and coil may be used in connection with an MRI magnet. Such a magnet may similarly be used for the construction of electrical machines in general such as, for example, transformers, motors, generators, current limiters, power accumulation systems, multi-polar magnets, etc.

In one embodiment, a magnet working in a persistent regime is composed by several windings. In order to operate a superconducting magnet in persistent mode, all of the electrical joints must be superconductive. Thus, the several windings are connected in series to each other by superconducting joints to create a coil. The ends of the coil are then short circuited by a superconducting switch. FIGS. 12a-12d depict various coil configurations that may be used in this embodiment.

FIGS. 15, 16a, 16b and 17 show by way of example, a magnet, denoted overall by 100, of a magnetic resonance imaging apparatus of the open-roof type. The magnet 100 comprises a U-shaped yoke 150 which is made from ferromagnetic material. The yoke 150 connects a pair of pole faces 110 which are situated at a distance from each other along a polar axis x. The magnet 100 is arranged vertically so that the polar axis is arranged horizontally and above the central part 150a of the yoke 150. The pole faces 110 define between them a receiving zone R for a patient.

As shown in FIGS. 16a and 16b, the magnet 100 also comprises two coils 200 which are each arranged concentrically around each of the pole faces 110, respectively. These coils can be conventionally controlled by a control unit (not shown) so as to generate a magnetic flux inside the receiving zone R.

Each coil 200 comprises a vacuum chamber 210 formed in the manner of a casing with a substantially annular shape and rectangular box-like cross-section. The vacuum chambers 210 are secured to the magnetic yoke 150 by means of non-magnetic supports (not shown).

The vacuum chambers 210 are connected together by a connection duct 220 which is in turn connected to a vacuum system (not shown) of the conventional type.

Each vacuum chamber houses internally a respective set of windings 300 with a generally annular shape extending both axially and circumferentially inside the vacuum chamber 210. Each set of windings is enclosed inside a respective support structure 400 which is in turn secured to a wall of the vacuum chamber 210. A heat screen 500 arranged around each set of windings 300 may also be envisaged, said screen being formed as a substantially annular-shaped casing with a rectangular box-like cross-section and also being secured to the wall of the vacuum chamber 210 by means of supports with a low thermal conductivity (not shown). The two heat screens 500 respectively arranged around the two sets of windings 300 are connected together in a thermally conductive manner by a tubular connecting section 510 extending inside the connection duct 220 of the vacuum chambers 210.

FIGS. 16a and 16b also show a cryogenic cooling system 600. This system comprises at least one cryocooler 610 with two refrigeration stages 620 and 630, the first refrigeration stage 620 of which is connected in a thermally conductive manner to the tubular connecting section 51 of the heat screens 500. In this way, the cryocooler 610 is able to cool the heat screens 500 to a temperature in the range of 40 to 150 K so as to minimize the heat dispersion to the outside. The cryocooler 610 is secured to the wall of the connection duct 220 of the vacuum chambers 210. The position of the cryocooler 610 is optimized so as to function in the most efficient manner possible and minimize the problems associated with space, vibration and noisiness. As an alternative to the single cryocooler a respective cryocooler for each coil 200 may be used.

The electrical supplying of power to the sets of superconducting windings 300 is provided using electrical feedthroughs which may be optimized for low cryogenic consumption and which are connected on one hand to the terminals 311, 312 of each set of windings, and on the other hand, to an external power supplier via the vacuum chamber.

The superconducting joint, junction, wire and coil using a granular superconducting substance, as is described above, enables the maintenance of a continuous superconducting circuit at temperatures as high as 20-30 Kelvin. Further, the superconducting joint and junction are operative for all types of superconducting segments, wires, and coils. This has particular relevance for superconducting coils in MRI magnets.

It will be understood that the above description of the present invention is susceptible to various modifications, changes and adaptations, and that the same are intended to be comprehended within the meaning and range of equivalents of the appended claims.

What is claimed is:

1. A superconducting joint that structurally binds a first superconducting segment to a second superconducting segment, wherein each of the first and second superconducting segments comprise corresponding areas containing a granular superconducting substance formed by a first element and a second element, said superconducting joint comprising a solid non-superconducting binding formed from a source of said first element and a source of said second element combined to produce the granular superconducting substance around the solid non-superconducting binding to permit for the flow of superconducting current through the first superconducting segment and the second superconducting segment.

2. The superconducting joint according to claim 1, wherein the solid non-superconducting binding comprises at least one of a metallic structure or an alloy structure.

3. The superconducting joint according to claim 1, wherein at least one of the first superconducting segment and the second superconducting segment comprises a plurality of longitudinal filaments containing the granular superconducting substance.

4. The superconducting joint according to claim 1, wherein said first element comprises magnesium, said second element comprises boron and said granular superconducting substance comprises magnesium diboride.

5. The superconducting joint according to claim 1, wherein at least one of said sources of said first or second element comprises at least one of a binary source or a ternary source.

6. The superconducting joint according to claim 3, wherein at least one of said sources of said first source or second element comprises at least one of aluminum, carbon, cobalt, chromium, iron, manganese, molybdenum, niobium, nickel, palladium, ruthenium, scandium, silicon, titanium, vanadium, yttrium, zirconium, cerium, platinum, cadmium, gallium, gadolinium, geranium, hydrogen, lanthanum, lead, tin, strontium, thallium, zinc, iridium or copper.

7. The superconducting joint according to claim 1, wherein each first and second superconducting segments comprise a conductive area and wherein said joint further comprises a solid non-superconducting binding structurally coupling the conductive area of the at least one superconducting segment to the conductive area of the at least one superconducting segment.

8. The superconducting joint of claim 7, wherein said conductive areas form filaments containing the granular superconducting substance.

9. A superconducting wire, comprising:
a first superconducting segment;
a second superconducting segment; and
a superconducting joint that structurally binds the first superconducting segment to the second superconducting segment, wherein each of the first and second superconducting segments comprise corresponding areas containing a granular superconducting substance formed by a first element and a second element, said superconducting joint comprising a solid non-superconducting binding formed from a source of said first element and a source of said second element combined to produce the granular superconducting substance around the solid non-superconducting binding to permit for the flow of superconducting current through the first superconducting segment and the second superconducting segment.

10. The superconducting wire according to claim 9, wherein at least one of the first superconducting segment and the second superconducting segment comprises a plurality of longitudinal filaments containing the granular superconducting substance.

11. A method for structurally binding a first superconducting segment to a second superconducting segment, the steps comprising:
exposing areas of the first superconducting segment and the second superconducting segment containing a granular superconducting substance formed by a first element and a second element;
positioning the first superconducting segment relative to said second superconducting segment;
disposing a granular substance on the exposed areas of the first superconducting segment and the second superconducting segment; and
forming a solid non-superconducting binding between the first superconducting segment and the second superconducting segment from a source of said first element and a source of said second element combined to produce the granular superconducting substance around the solid non-superconducting binding to permit for the flow of superconducting current through the first superconducting segment and the second superconducting segment.

12. The method according to claim 11, wherein the solid non-superconducting binding comprises at least one of a metallic structure or an alloy structure.

13. The method according to claim 11, wherein at least one of the first superconducting segment and the second superconducting segment comprises a plurality of longitudinal filaments containing the granular superconducting substance.

14. The method according to claim 11, wherein at least one of said sources of said first or second element comprises at least one of a binary source or a ternary source.

15. The method according to claim 11, wherein the step of structurally binding comprises heating said source of said first element and said source of said second element at the exposed areas.

16. The method according to claim 15, wherein the step of structurally binding further comprises applying sufficient pressure to permit reaction during the heating of said first element and said source of said second element at the exposed areas.

17. The method according to claim 11, wherein the step of exposing said areas comprises one of mechanical etching, chemical etching, mechanical grinding, metal melting or cutting.

18. The method according to claim 11, wherein said positioning requires orienting the exposed areas to lie adjacent to each other.

19. The method according to claim 11, said positioning requires orienting the exposed areas to face each other.

* * * * *